PROCESS FOR PREPARING P-N JUNCTIONS IN SEMICONDUCTORS

Filed June 10, 1959

WITNESSES

John E. Healy, Jr.

Charles L. Menzemer

Current (Ma)

INVENTOR

Harold F. John

BY

Frederick Shapoe

ATTORNEY

United States Patent Office 3,054,701
Patented Sept. 18, 1962

3,054,701
PROCESS FOR PREPARING P-N JUNCTIONS IN SEMICONDUCTORS

Harold F. John, Wilkinsburg, Pa., assignor to Westinghouse Electric Corporation, East Pittsburgh, Pa., a corporation of Pennsylvania Filed June 10, 1959, Ser. No. 819,304
5 Claims. (Cl. 148—1.5)

Figure 1:
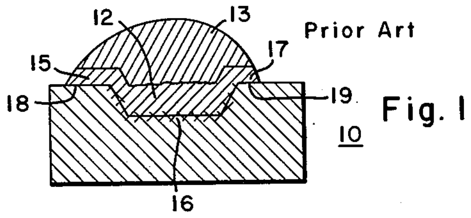

This invention relates to a new and improved process for preparing a junction between two zones of different type semiconductivity within a body of a semiconductor material.

When preparing junctions within a body of a semiconductor material by the alloy fusion technique, the body of semiconductor material and the doping alloy, in the form of pellets or foils or the like, are placed in close contact or sandwiched together, heated to a temperature at or above the melting point of the doping alloy whereby it dissolves some of the semiconductor material, and subsequently cooled to allow recrystallization of a doped zone from the melt of the alloy. A semiconductor transition region or junction exists between or near the newly formed recrystallized doped zone and the zone comprised of the unmelted portion of the original body of semiconductor material in contact therewith.

In the past, it has been thought necessary for best results to perform the fusion operation (i.e., dissolving and recrystallizing) in an environment free of oxidizing contaminants. If such oxidizing contaminants are present, the surface of the body of semiconductor material and the doping alloy become oxidized, causing irregular and non-reproducible wetting of the semi-conductor material by the molten alloy. The presence of oxidizing contaminants can also cause unwetted areas within the fused regions, which are very deleterious to device performance. Consequently, fusions are usually performed in a reasonably good vacuum, in a purified hydrogen atmosphere, or in an inert atmosphere, such as a nitrogen or helium atmosphere.

It has been found, however, that when the alloying is carried out in a vacuum, hydrogen or inert atmosphere, the molten doping alloy rapidly spreads in relatively poorly controllable manner over the surface of the body of semiconductor material upon which it is disposed. This erratic spreading becomes more pronounced as the temperature is raised. The doping alloys spreading is in fact so rapid that the semiconductor material covered by it ordinarily cannot be dissolved to a uniform depth. Thereafter, when the temperature is lowered, part of the semiconductor material that has been dissolved within the molten doping alloy recrystallizes over the semiconductor material that has been covered by the doping alloy but not dissolved by it. When a semiconductor transition region or junction is formed in this manner the semiconductor device produced therefrom is inferior and generally unsatisfactory.

An object of this invention is to provide for oxidizing a surface of a semiconductor body, having relatively oxide-free surfaces, while it is being acted upon by a mass of a molten doping alloy and after the mass of molten doping alloy has spread to a selected area, in order to control the area and depth of doping of the semiconductor body by the doping alloy.

A further object of the present invention is to provide an improved process for preparing semiconductor transition regions or junctions within a body of semiconductor material by the alloy fusion method comprising (1) disposing a quantity of a suitable doping alloy upon one surface of a body of semiconductor material, (2) heating the assembly to a first elevated temperature above the melting point of the doping alloy in a non-oxidizing atmosphere for a period of time to secure a desired degree of spreading of the melt, (3) then heating the assembly to a second and higher elevated temperature and simultaneously applying an oxidizing atmosphere, (4) maintaining said elevated temperature and oxidizing atmosphere for a predetermined time, and (5) thereafter cooling the assembly to recrystallize dissolved semiconductor material from the molten doping alloy while maintaining the oxidizing atmosphere, whereby a transition region or junction is produced between the original body of semiconductor material and the area of recrystallized semiconductor material.

Another object of the present invention is to provide a process for producing a semiconductor transition region or junction by the alloy fusion method in which the semiconductor material directly underneath the molten alloy over a selected areas is dissolved by the molten doping alloy to a uniform depth.

Other objects will, in part, be obvious and will, in part, appear hereinafter.

Figure 6:
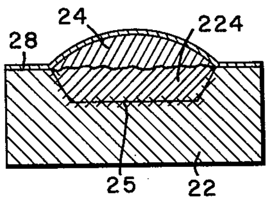
Figure 7:
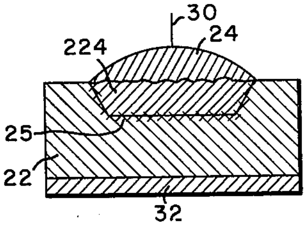
Figure 8:
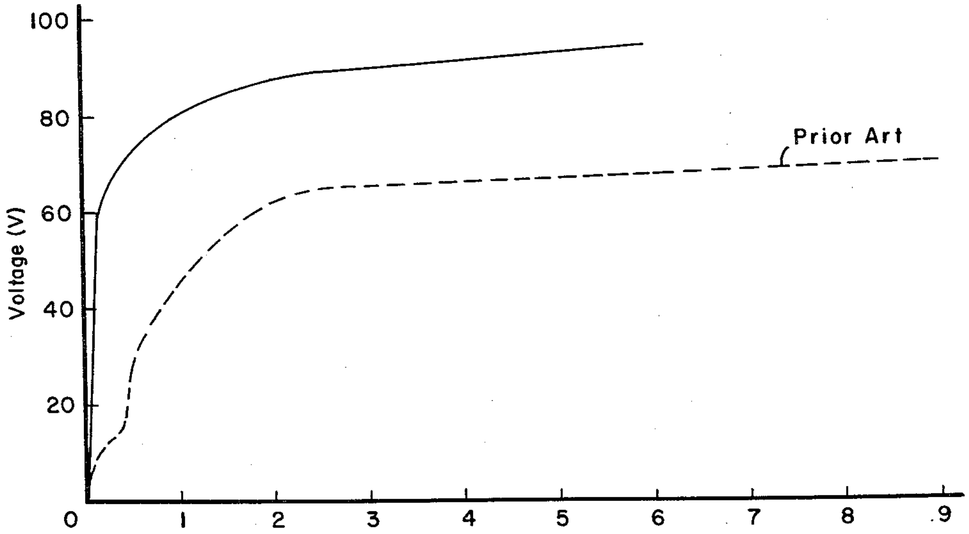

For a better understanding of the nature and objects of this invention, reference should be had to the following detailed description and drawings, in which:

FIGURE 1 is a side view in cross-section of a body of semiconductor material treated by the alloy fusion method in accordance with the prior art;

FIGS. 2 to 7 inclusive are side views in cross-section of a body of semiconductor material undergoing alloy fusion in accordance with the teachings of this invention; and FIG. 8 is a graphical comparison of the I–V characteristics of a device prepared in accordance with the teaching of this invention and a device prepared in accordance with the prior art practice.

In accordance with the present invention and attainment of the foregoing objects, there is provided a process for preparing a semiconductor transition region within a body of semiconductor material comprising, (1) disposing a quantity of a doping material upon a surface of a body of a semiconductor material, said body of semiconductor material having a first type of semiconductivity, said doping material being comprised of at least one material capable of establishing a zone of a second type semiconductivity within the body of semiconductor material, (2) heating said body of semiconductor material and doping alloy to a first elevated temperature in a non-oxidizing atmosphere, whereby the doping material melts and spreads over a selected portion of the body and dissolves a portion of the semiconductor material, (3) thereafter, when the spreading has reached a point where the molten alloy covers a selected area, heating said molten doping material and body of semiconductor material to a second elevated temperature, which is higher than said first elevated temperature, and concurrently applying an oxidizing atmosphere, (4) maintaining said second elevated temperature whereby the molten doping material only dissolves additional portions of the underlying part of the body of semiconductor material, and (5) cooling the molten doping material with semiconductor material therein, while maintaining the oxidizing atmosphere, whereby the semiconductor material dissolved within the molten doping material recrystallizes with some doping material trapped therein forming a zone of second type semiconductivity and a semiconductor transition region between said zone of second type semiconductivity and said body of semiconductor material having a first type of semiconductivity.

For the reasons stated previously above, it has been the practice to carry out the preparation of a p-n junction, by the alloy diffusion method, in a non-oxidizing atmosphere. The procedure is not always satisfactory and results in the formation of many inferior junctions which leads to inferior semiconductor devices. With reference to FIG. 1, there is illustrated, in cross-section, a body of semiconductor material 10 comprised of a first zone 11 of a first type semiconductivity, a second zone 12 of a second type semiconductivity, a layer 1 of surplus doping material remaining after the formation of zone 12 and a semiconductor transition region or p-n junction 16 between zones 12 and 11. The p-n junction 16 has been prepared by alloy fusion in a non-oxidizing atmopshere. Zone 12 is comprised of recrystallized material from zone 11 in which a quantity of doping material is trapped. Regions 15 and 17 of zone 12 are comprised of recrystallized material from zone 11 in which some doping material has been trapped, and which has recrystallized upon portions 18 and 19 of zone 11. Portions 18 and 19 of zone 11 were either not dissolved or not sufficiently dissolved to remove surface contamination during the alloy fusion. It is the recrystallization of material upon a portion of relatively undissolved semiconductor material that produces an inferior junction between zones 11 and 12. The formation of the deleterious regions 15 and 17 is prevented in the process of this invention.

Figure 2:
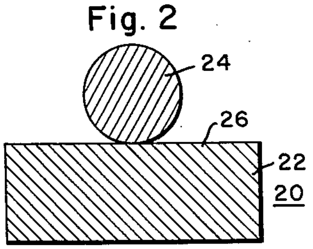

The present invention is illustrated in FIGURES 2 to 7. With reference to FIG. 2, there is illustrated an assembly 20 comprised of a body 22 of a semiconductor material, and a quantity of a doping material 24 disposed upon surface 26 of body 22.

The body 22 may be comprised of any suitable semiconductor material, for example silicon, germanium and stoichiometric compounds of elements of group III of the periodic table, for example gallium, aluminum, and indium and elements of group V of the periodic table, for example arsenic, phosphorus and antimony. Examples of suitable III–V stoichiometric compounds include gallium arsenide, gallium antimonide, gallium phosphide, indium arsenide and indium antimonide. The body 22 may have a P, N or I type semiconductivity and may have been prepared by any of the methods known to those skilled in the art. For example, the body 22 may have been cut from a suitably doped or intrinsic rod of material or it may be a fragment of a dendrite prepared as set forth in Westinghouse Case Serial No. 757,832, filed August 28, 1958, now abandoned, the assignee being the same as the assignee of this invention.

The doping material 24, which may be in the form of a pellet, foil or the like, may be comprised of any suitable material capable of imparting a second type of semiconductivity to body 22. For example, when body 22 has a n-type semiconductivity the doping material 24 may be comprised of boron, aluminum, gallium, indium and mixtures and alloys thereof with neutral materials such as gold, silver, tin and lead. When body 22 has a p-type semiconductivity the doping material 24 may be comprised of phosphorus, arsenic, antimony and alloys and mixtures or alloys thereof. If the body 22 is intrinsic (I) the doping material may be either n- or p-type dopants depending on the doping result desired.

The assembly 20 is charged into a furnace and heated to a first elevated temperature above the melting point of the doping material 24 in a non-oxidizing atmosphere, for example a vacuum of approximately $10^{-3}$ to $10^{-5}$ mm. Hg absolute pressure, or a purified hydrogen, nitrogen or helium atmosphere.

Figure 3:
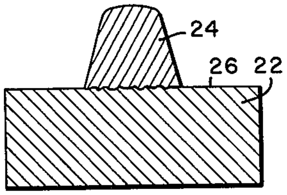

With reference to FIG. 3, the doping material 24 begins to melt and wets a portion of surface 26 of body 22. The doping material 24 also will begin to dissolve some of the underlying semiconductor material along the wetted portion of surface 26 of the body 22.

It is well known to those skilled in the art that the temperature at which any particular doping material or alloy is fused to a particular semiconductor material depends upon the materials involved. For example, the fusion of a pellet of indium to an n-type germanium wafer is usually carried out at a temperature in the range of 400–600° C. The fusion of a 5% antimony-95%, by weight, gold alloy to p-type germanium is usually carried out at a temperature in the range of 500° C. to 600° C. Aluminum is generally fused to n-type silicon at a temperature of approximately 700–900° C., while an alloy comprised of 0.5% antimony and 99.5%, by weight, gold is generally fused to p-type silicon at a temperature within the range of 600° C. to 900° C. The first elevated temperature is approximately from 25° C. to 75° C. below the usual fusion temperature, however, in any case it is above the melting point of the doping alloy.

Figure 4:
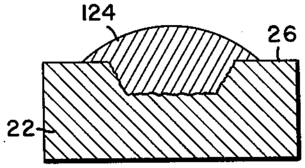
Figure 5:
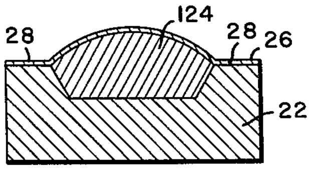

After a period of time, as seen with reference to FIG. 4, there is illustrated an assembly showing the device at the end of the first elevated temperature period where spreading of the molten alloy 24 has reached a selected extent. The assembly is comprised of a body 22 of semiconductor material of first type semiconductivity and a molten mass 124 comprised of molten doping alloy and dissolved semiconductor material. The doping material has spread over the desired area of surface 26. To terminate further spreading, an oxidizing atmosphere, for example an oxygen atmosphere at an absolute pressure of 10 to 100 microns, is introduced at this point and the assembly is heated to a second higher elevated temperature, the actual value of which has been chosen to achieve a desired effect, as for example, the dissolution of a predetermined amount of the semiconductor wafer. The assembly is maintained at the second elevated temperature while subjected to the oxidizing atmosphere, until the desired solution is achieved. The oxidizing atmosphere forms an oxide film 28 on the exposed surfaces of the body 22 and/or molten doping alloy 124 and arrests the spreading of the molten doping material along surface 26. In a predetermined period of time, a uniform depth of the underlying semiconductor material of body 22 which is wetted by the doping material, is dissolved by the doping material. The assembly at this stage of the process is illustrated in FIG. 5.

After the desired depth of alloying and fusion is attained, the assembly is allowed to cool to room temperature in the oxidizing atmosphere. During cooling, the semiconductor material dissolved within the molten doping material recrystallizes and is actuated with the doping materials. The resultant doped semiconductor structure is shown in FIG. 6. The semiconductor structure is comprised of the body 22 of semiconductor material which constitutes a zone of a first type semiconductivity, and a zone 224 comprised of recrystallized semiconductor material with doping material therein. Zone 224 is of a second type semiconductivity relative to the zone of first type semiconductivity. A semiconductor transistion region or junction 25 is formed between the zone of first type semiconductivity and the zone of second type semiconductivity. Junction 25 is a P–N, P–I, or N–I junction depending upon the semiconductivity of the first and second zones. The excess doping alloy 24 has resolidified over zone 224.

It will be noted from FIG. 6 that there has been no recrystallization of semiconductor material and doping alloy over undissolved portions of surface 26 as in the prior art process illustrated in FIG. 1.

The semiconductor structure of FIG. 6 may be fashioned into a semiconductor device by the attachment of metal electrical leads or contacts 30 and 32 thereto as illustrated in FIG. 7. The contacts may be applied in any manner known to those skilled in the art.

The following examples are illustrative of the practice of this invention. Example I illustrates the process of this invention and Example II illustrates the prior art.

*Example I*

A pellet of indium was disposed upon one surface of an n-type germanium wafer. The wafer of germanium had a resistivity of from 1 to 1.5 ohm-cm.

The assembly was placed in a furnace. The furnace was evacuated to approximately $10^{-5}$ mm. Hg absolute pressure and the assembly heated to a temperature of approximately 475° C. therein.

Under these conditions the indium melted and spread so as to cover and wet a portion of the surface of the germanium wafer.

When the desired area of the wafer surface was covered, an oxidizing atmosphere comprising oxygen gas at a pressure of 50 microns was introduced into the furnace and the temperature within the furnace raised to 500° C.

The oxidizing atmosphere oxidized the exposed germanium and/or molten In surface and arrested the spreading of the molten indium upon the surface of the germanium. The indium then dissolved the germanium lying beneath the molten portion to a uniform depth.

The assembly was then allowed to cool to room temperature while exposed to the oxidizing atmosphere, whereby the germanium that had been dissolved by the molten indium recrystallized and was saturated with indium. The recrystallized layer had a p-type semiconductivity. A p-n junction existed between the n and p layers of the doped germanium wafer.

Metal contacts were soldered to the assembly and the I–V characteristics were determined. The I–V characteristics are shown graphically as a solid line in FIG. 8.

*Example II*

A pellet of indium was disposed upon one surface of a second n-type germanium wafer. The wafer of germanium had a resistivity of from 1 to 1.5 ohm-cm.

The indium was fused to the germanium in a vacuum of about $10^{-5}$ mm. Hg and a temperature of approximately 500° C. in accordance with the prior art.

Metal contacts were soldered to the assembly and the I–V characteristics were determined. The I–V characteristics are shown graphically as a dotted line in FIG. 8.

From a study of FIG. 8, it can be seen that the device prepared in accordance with the teachings of this invention has a higher peak inverse voltage than the device of the prior art, and that the device prepared in accordance with the teachings of this invention has a lower and much smoother saturation current curve than the prior art device.

While the invention has been described with reference to particular embodiments and examples, it will be understood, of course, that modification, substitution and the like may be made therein without departing from its scope.

I claim as my invention:

1. A process for preparing a semiconductor transition region within a body of semiconductor material comprising, (1) disposing a member comprised of a solid doping material upon a surface of a body of semiconductor material, said body of semiconductor material having a first type of semiconductivity, said doping material being comprised of at least one material capable of establishing a zone of a second type semiconductivity within the body of semiconductor material, (2) heating said body of semiconductor material and doping material to a first elevated temperature in a non-oxidizing atmosphere sufficient to melt the doping material and dissolve a substantial portion of the underlying semiconductor material, (3) heating said molten doping material and body of semiconductor material to a second elevated temperature, which is higher than said first elevated temperature, in an oxidizing atmosphere, (4) maintaining said second elevated temperature, whereby the molten doping material dissolves an additional portion of the body of semiconductor material without further appreciable lateral spreading, and (5) cooling the molten doping material with the semiconductor material dissolved therein while maintaining the oxidizing atmosphere, whereby the semiconductor material dissolved within the molten doping material recrystallizes with some doping material present therein and thereby forms a zone of second type semiconductivity and a semiconductor transition region between said zone of second type semiconductivity and said body of semiconductor material having a first type of semiconductivity.

2. A process for preparing a semiconductor transition region within a body of semiconductor material comprising, (1) disposing a member comprised of a doping material upon a solid surface of a body of semiconductor material, said body of semiconductor material having a first type of semiconductivity, said doping material being comprised of at least one material capable of establishing a zone of a second type semiconductivity within the body of semiconductor material, (2) heating said body of semiconductor material and doping material to a first elevated temperature in a non-oxidizing atmosphere sufficient to melt the doping material and dissolve a substantial portion of the underlying semiconductor material, (3) heating said molten doping material and body of semiconductor material to a second elevated temperature, said second elevated temperature being from 25° C. to 75° C. higher than said first elevated temperature, in an oxidizing atmosphere, (4) maintaining said second elevated temperature, whereby the molten doping material dissolves an additional portion of the body of semiconductor material without further appreciable lateral spreading, and (5) cooling the molten doping material with the semiconductor material dissolved therein while maintaining the oxidizing atmosphere, whereby the semiconductor material dissolved within the molten doping material recrystallizes with some doping material present therein and thereby forms a zone of second type semiconductivity and a semiconductor transition region between said zone of second type semiconductivity and said body of semiconductor material having a first type of semiconductivity.

3. A process for preparing a semiconductor transition region within a body of semiconductor material comprising, (1) disposing a member comprised of a solid doping material upon a surface of a body of semiconductor material selected from the group consisting of silicon and germanium, said body of semiconductor material having a first type of semiconductivity, said doping material being comprised of at least one material capable of establishing a zone of a second type semiconductivity within the body of semiconductor material, (2) heating said body of semiconductor material and doping material to a first elevated temperature in a non-oxidizing atmosphere sufficient to melt the doping material and dissolve a substantial portion of the underlying semiconductor material, (3) heating said molten doping material and body of semiconductor material to a second elevated temperature, said second elevated temperature being from 25° C. to 75° C. higher than said first elevated temperature, in an oxidizing atmosphere, (4) maintaining said second elevated temperature, whereby the molten doping material dissolves an additional portion of the body of semiconductor material without further appreciable lateral spreading, and (5) cooling the molten doping material with the semiconductor material dissolved therein while maintaining the oxidizing atmosphere, whereby the semiconductor material dissolved within the molten doping material recrystallizes with some doping material present therein and thereby forms a zone of second type semiconductivity and a semiconductor transition region between said zone of second type semiconductivity and said body of semiconductor material having a first type of semiconductivity.

4. A process for preparing a semiconductor transition region within a body of semiconductor material comprising, (1) disposing a member comprised of a doping material upon a solid surface of germanium having a first type of semiconductivity, said doping material being comprised of at least one material capable of establishing a zone of a second type semiconductivity within the germanium, (2) heating said body of semiconductor material and doping material to a first elevated temperature in a non-oxidizing atmosphere sufficient to melt the doping material and dissolve a substantial portion of the underlying semiconductor material, (3) heating said molten doping material and body of semiconductor material to a second elevated temperature, said second elevated temperature being from 25° C. to 75° C. higher than said first elevated temperature, in an oxidizing atmosphere, (4) maintaining said second elevated temperature, whereby the molten doping material dissolves an additional portion of the body of semiconductor material without further appreciable lateral spreading, and (5) cooling the molten doping material with the semiconductor material dissolved therein while maintaining the oxidizing atmosphere, whereby the semiconductor material dissolved within the molten doping material recrystallizes with some doping material present therein and thereby forms a zone of second type semiconductivity and a semiconductor transition region between said zone of second type semiconductivity and said body of semiconductor material having a first type of semiconductivity.

5. A process for preparing a semiconductor transition region within a body of semiconductor material comprising, (1) disposing a member comprised of a doping material upon a solid surface of silicon having a first type of semiconductivity, said doping material being comprised of at least one material capable of establishing a zone of a second type semiconductivity within the silicon, (2) heating said body of semiconductor material and doping material to a first elevated temperature in a non-oxidizing atmosphere sufficient to melt the doping material and dissolve a substantial portion of the underlying semiconductor material, (3) heating said molten doping material and body of semiconductor material to a second elevated temperature, said second elevated temperature being from 25° C. to 75° C. higher than said first elevated temperature, in an oxidizing atmosphere, (4) maintaining said second elevated temperature, whereby the molten doping material dissolves an additional underlying portion of the body of semiconductor material without further appreciable lateral spreading, and (5) cooling the molten doping material with the semiconductor material dissolved therein while maintaining the oxidizing atmosphere, whereby the semiconductor material dissolved within the molten doping material recrystallizes with some doping material present therein and thereby forms a zone of second type semiconductivity and a semiconductor transition region between said zone of second type semiconductivity and said body of semiconductor material having a first type of semiconductivity.

References Cited in the file of this patent

UNITED STATES PATENTS

| | | |
|---|---|---|
| 2,748,325 | Jenny | May 29, 1956 |
| 2,802,760 | Derick | Aug. 13, 1957 |
| 2,823,149 | Robinson | Feb. 11, 1958 |
| 2,825,667 | Mueller | Mar. 4, 1958 |
| 2,879,190 | Logan | Mar. 24, 1959 |
| 2,932,594 | Mueller | Apr. 12, 1960 |